(12) United States Patent
Chiu et al.

(10) Patent No.: US 9,673,151 B2
(45) Date of Patent: Jun. 6, 2017

(54) SEMICONDUCTOR PACKAGE HAVING METAL LAYER

(71) Applicant: Siliconware Precision Industries Co., Ltd., Taichung (TW)

(72) Inventors: Chih-Hsien Chiu, Taichung (TW); Hao-Ju Fang, Taichung (TW); Hsin-Lung Chung, Taichung (TW); Cho-Hsin Chang, Taichung (TW); Tsung-Hsien Tsai, Taichung (TW); Chia-Yang Chen, Taichung (TW); Chun-Chi Ke, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/837,604

(22) Filed: Aug. 27, 2015

(65) Prior Publication Data
US 2016/0093576 A1   Mar. 31, 2016

(30) Foreign Application Priority Data
Sep. 30, 2014  (TW) .............................. 103133886 A

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4853* (2013.01); *H01L 21/54* (2013.01); *H01L 21/561* (2013.01); *H01L 21/563* (2013.01); *H01L 21/78* (2013.01); *H01L 23/16* (2013.01); *H01L 23/3114* (2013.01); *H01L 23/3128* (2013.01); *H01L 25/0655* (2013.01); *H01L 23/49811* (2013.01); *H01L 23/49838* (2013.01); *H01L 2224/48091* (2013.01);
(Continued)

(58) Field of Classification Search
None
See application file for complete search history.

(56) References Cited

U.S. PATENT DOCUMENTS

| | | | | |
|---|---|---|---|---|
| 2009/0302439 | A1* | 12/2009 | Pagaila ................... | H01L 23/29 257/660 |
| 2013/0271928 | A1* | 10/2013 | Shimamura .......... | H05K 9/0084 361/748 |
| 2015/0271959 | A1* | 9/2015 | Chen .................... | H05K 9/0024 361/760 |

* cited by examiner

*Primary Examiner* — Cory Eskridge
(74) *Attorney, Agent, or Firm* — Mintz Levin Cohn Ferris Glovsky and Popeo, P.C.; Peter F. Corless; Steven M. Jensen

(57) ABSTRACT

A semiconductor package is provided, including: a substrate having opposing first and second surfaces; a plurality of semiconductor components disposed on and electrically connected to the first surface; an encapsulant encapsulating the first surface and the semiconductor components and having at least one first groove that partitions the substrate into a plurality of package units, each of which has at least one of the semiconductor components; and a metal layer formed on the substrate and the encapsulant and encapsulating a periphery of the package units, with the second surface exposed from the metal layer, wherein the metal layer is formed along a wall surface of the first groove, to form a second groove corresponding in position to the first groove and having a metal surface. Therefore, the package units are isolated and form a multilayer isolated structure, including metal layers and air layers, and are electromagnetically shielded from one another.

10 Claims, 6 Drawing Sheets

(51) Int. Cl.
*H01L 21/54* (2006.01)
*H01L 21/56* (2006.01)
*H01L 21/78* (2006.01)
*H01L 23/16* (2006.01)
*H01L 23/31* (2006.01)
*H01L 25/065* (2006.01)
H01L 23/498 (2006.01)

(52) U.S. Cl.
CPC .............. *H01L 2224/48227* (2013.01); *H01L 2924/15311* (2013.01); *H01L 2924/181* (2013.01); *H01L 2924/1815* (2013.01)

SEMICONDUCTOR PACKAGE HAVING METAL LAYER

CROSS-REFERENCES TO RELATED APPLICATIONS

This application claims under 35 U.S.C. §119(a) the benefit of Taiwanese Application No. 103133886, filed Sep. 30, 2014 the entire contents of which are incorporated herein by reference.

BACKGROUND OF THE INVENTION

1. Field of the Invention

The present invention relates to package structures, and, more particularly, to a package structure having an electromagnetic shielding function, and a related method.

2. Description of Related Art

With the rapid growth in electronic industry, several packaging types of electronic products have been developed. Several semiconductor packages are configured to have a shielding function in order to prevent electromagnetic interference (EMI).

As shown in FIGS. 1A and 1B, a conventional RF module 1 is fabricated by electrically connecting a plurality of semiconductor components 11a and 11b to a substrate 10, forming an encapsulant 12 such as epoxy resin that encapsulates the semiconductor components 11a and 11b and the substrate 10, and forming a metal thin film 13 covering the encapsulant 12. The encapsulant 12 protects the semiconductor components 11a and 11b and the substrate 10 from external damages, such as moist or contaminants, and the metal thin film 13 shields the semiconductor components 11a and 11b from EMI.

As shown in FIG. 2, another conventional RF module 2 has a shielding layer 23 around a periphery thereof to prevent electromagnetic interferences from occurring between the RF module 2 and another module.

However, though the conventional RF modules 1 and 2 are shielded from external EMI through a metal material such as the metal thin film 13 that covers the periphery thereof, EMI still occurs among the inner semiconductor components 11a and 11b.

Hence, there is an urgent need for solving the prior art problems.

SUMMARY OF THE INVENTION

In view of the above-mentioned drawbacks of the prior art, the present invention provides a semiconductor package, comprising: a substrate having opposing first and second surfaces; a plurality of semiconductor components disposed on and electrically connected to the first surface of the substrate; an encapsulant encapsulating the first surface of the substrate and the semiconductor components and having at least one first groove that partitions the substrate into a plurality of package units, wherein each of the package units has at least one of the semiconductor components; and a metal layer formed on the substrate and the encapsulant and encapsulating a periphery of the package units, with the second surface of the substrate exposed from the metal layer, wherein the metal layer is formed on a groove surface of the first groove, to form a second groove corresponding in position to the first groove and having a metal surface.

The present invention further provides a method for fabricating a semiconductor package, comprising: mounting a plurality of semiconductor components on a carrier, forming on the carrier an encapsulating body for encapsulating the semiconductor components; cutting the encapsulating body and the carrier to form a plurality of isolated prepatory packages, each of the prepatory packages comprising: a substrate having opposing first and second surfaces, wherein the substrate is subject to a portion of the carrier, a plurality of the semiconductor components disposed on and electrically connected to the first surface of the substrate; encapsulants being subject to a portion of the encapsulating body and encapsulating the first surface of the substrate and the at least one of the semiconductor components; forming on each of the encapsulants of the prepatory packages at least one first groove that partitions each of the substrate into a plurality of package units, each of which has at least one of the semiconductor components; and forming on each of the substrates and each of the encapsulants of the prepatory packages a metal layer that encapsulating a periphery of the package units, with each of the second surfaces of each of the substrates exposed from the metal layer, wherein each of the metal layers is formed along a wall surface of each of the first grooves, to form a second groove corresponding in position to the first groove and having a metal surface.

In an embodiment, the first groove is fabricated by laser or mechanical cutting techniques.

In an embodiment, the semiconductor package is a radio-frequency (RF) module.

In an embodiment, the semiconductor component is an RF chip. For instance, the RF chip is a Bluetooth chip or a Wi-Fi chip.

In an embodiment, the encapsulant has an exposed top surface, an exposed side surface, and a bottom surface coupled to the first surface of the substrate, and the at least one first groove penetrates the encapsulant to communicate the exposed top surface of the encapsulant with the first surface of the substrate. In an embodiment, the metal layer is formed on the exposed top surface and the exposed side surfaces of the encapsulant.

In an embodiment, the metal layer is made of a material selected from the group consisting of copper, nickel, iron, aluminum and stainless steel.

In an embodiment, when the encapsulant has a plurality of the first grooves, the first grooves are aligned in a line.

In an embodiment, the substrate has a grounding structure that is electrically connected with the metal layer. In an embodiment, the grounding structure is a grounding part which corresponds in position to the first groove and is electrically connected to the metal layer.

In an embodiment, the second groove is filled with a filling material, and the filling material is an insulating material or a conductive material.

In summary, the semiconductor package and the related method according to the present invention are characterized by forming a second groove corresponding in position to the first groove and having a metal layer. A multilayer isolated structure, including metal layers and air layers, is thus formed among the package units, and the package units are well shielded and protected from the electromagnetic interferences.

DETAILED DESCRIPTION OF THE PREFERRED EMBODIMENTS

The present invention is described in the following with specific embodiments, so that one skilled in the pertinent art can easily understand other advantages and effects according to the present invention from the disclosure according to the present invention.

It should be noted that all the drawings are not intended to limit the present invention. Various modification and variations can be made without departing from the spirit according to the present invention. Further, terms, such as "first", "second", "one" etc., are merely for illustrative purpose and should not be construed to limit the scope according to the present invention.

FIGS. 3A-3E are cross-sectional views showing a method of fabricating a semiconductor package 3 according to the present invention. In an embodiment, the semiconductor package 3 is a device that generates electromagnetic waves, for instance, a radio frequency (RF) module.

Figure 1A:
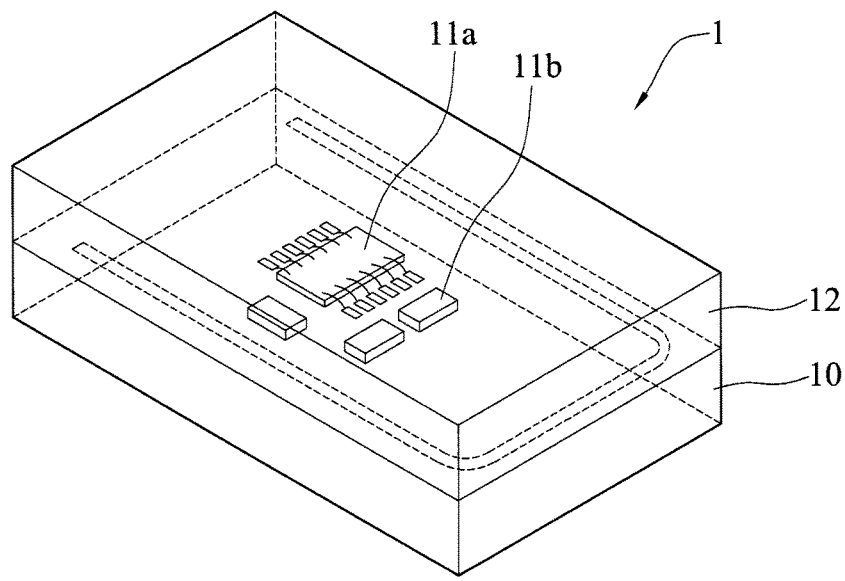
FIG. 1A shows a conventional RF module.
Figure 1B:
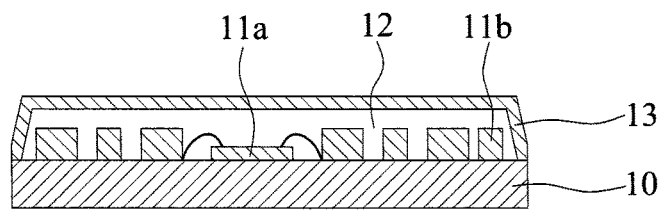
FIG. 1B shows a cross-sectional view of the RF module shown in FIG. 1A.
Figure 2:
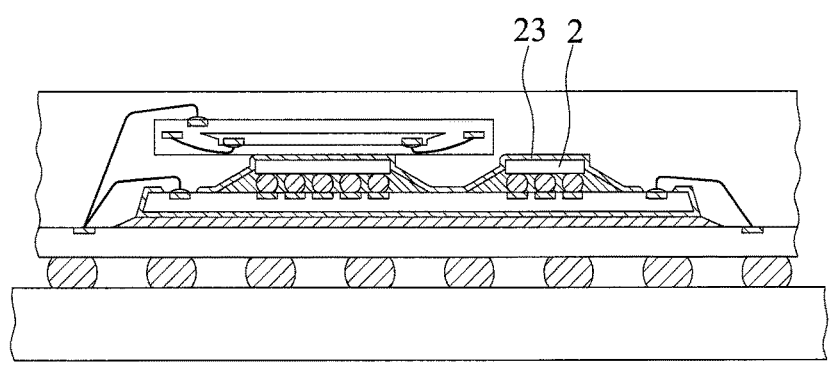
FIG. 2 shows a conventional stacked package having a plurality of modules.
Figure 3A:
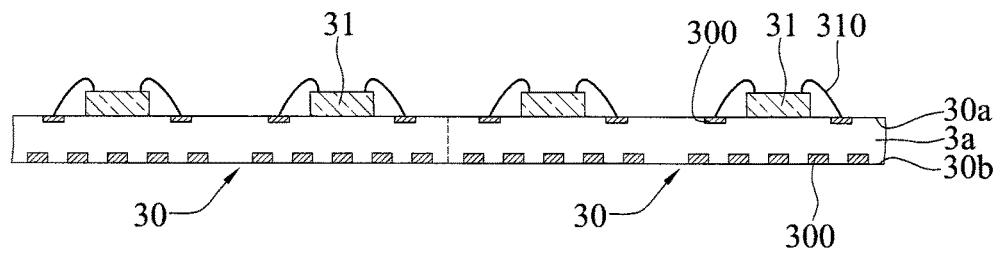
FIGS. 3A-3E are cross-sectional views illustrating a method of fabricating a semiconductor package according to the present invention; wherein FIGS. 3A' and 3E' show another embodiment of FIGS. 3A and 3E, and FIG. 3D' is a 3D view of FIG. 3D.
Figure 3A:
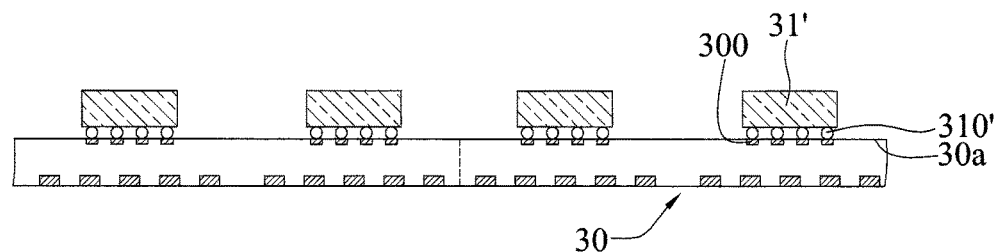

As shown in FIGS. 3A and 3A', a carrier 3a is provided. The carrier 3a has a plurality of substrates 30 (partitioned by the dashed lines in the drawings), and each of the substrates 30 has opposing first and surfaces 30a and 30b. A plurality of semiconductor components 31 are formed on the carrier 3a, that is formed on the first surface 30a of each of the substrates 30.

The substrate 30 has a plurality of conductive pads 300 disposed on the first surface 30 and on the second surface 30.

In an embodiment, the semiconductor components 31 RF chips, such as Bluetooth chips or Wireless Fidelity (Wi-Fi) chips.

Further, as shown in FIG. 3A, the semiconductor components 31 are electrically connected with the corresponding conductive pads 300 of the substrate 30 via a wire bonding method (i.e., bonding wires 310); alternatively, as shown in FIG. 3A', the semiconductor components 31' are electrically connected with the corresponding conductive pads 300 via a flip-chip method (that is via the solder balls or conductive elements 310' such as conductive bumps 310').

Figure 3B:
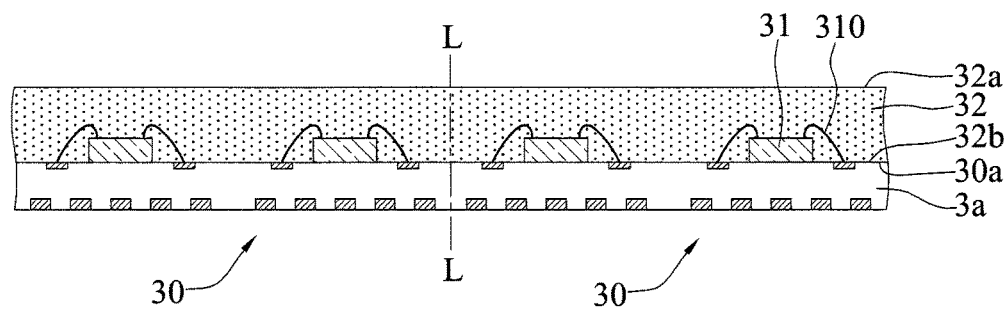

As shown in FIG. 3B, following the process described in FIG. 3A, an encapsulant 32 encapsulates the first surface 30a (or the substrate 30) of the carrier 3a, the semiconductor components 31, and the bonding wires 310.

In an embodiment, the encapsulant 32 has an exposed top surface 32a, and a bottom surface 32b coupled to the first surface 30a.

Figure 3C:
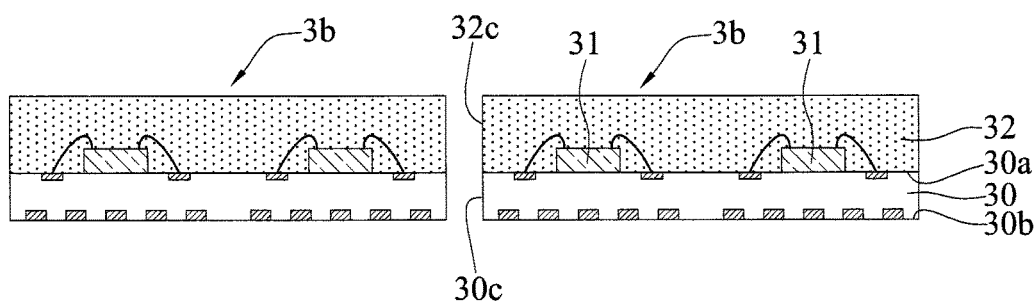

As shown in FIG. 3C, the encapsulant 32 and the carrier 3a are cut along a cutting line L (shown in FIG. 3B) of a periphery of the substrate 30, to form a plurality of isolated prepatory packages 3b.

In an embodiment, each of the prepatory packages 3b comprises a substrate 30 having a first surface 30a, a second surface 30b, and side surfaces 30c abutting the first surface 30a and the second surface 30b, a plurality of semiconductor components 31 formed on the first surface 30a of the substrate 30, and an encapsulant 32 encapsulating the first surface 30a and the semiconductor components 31. In an embodiment, the encapsulant 32 is cut to have side surfaces 32c.

Figure 3D:
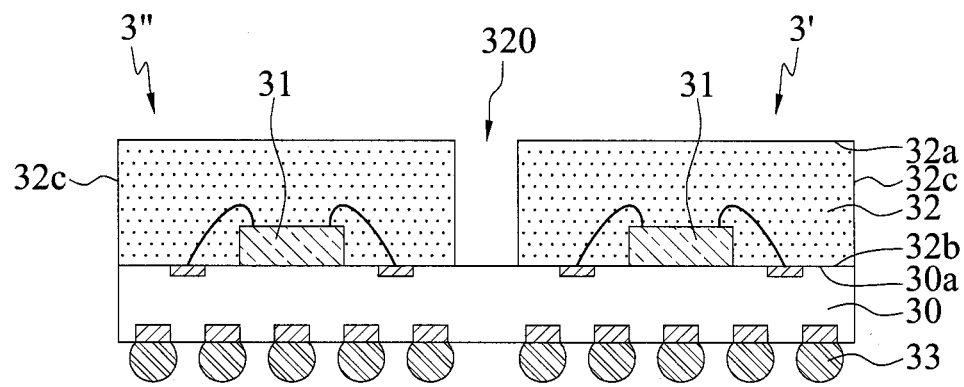
Figure 3D:
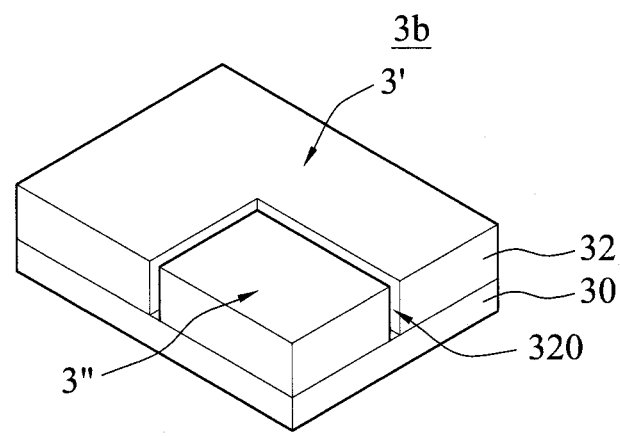

As shown in FIGS. 3D and 3D', a first groove 320 is formed on the encapsulant 32 of the prepatory package 3b by laser or mechanical cutting techniques such as using a knife, and the first surface 30a of the substrate 30 is partitioned into a plurality of package units 3' and 3". Each of the package units 3' and 3" has at least one semiconductor component 31. In an embodiment, each of the package units 3' and 3" has electronic elements without interfering electromagnetic waves). A plurality of conductive elements 33 such as solder balls are disposed on the second surface 30b of the substrate 30.

In an embodiment, the first groove 320 penetrates the encapsulant 32 to communicate the top surface 32a of the encapsulant 32 with a portion of the first surface 30a of the substrate 30, with the remaining first surface 30a exposed from the first groove 320.

Figure 4A:
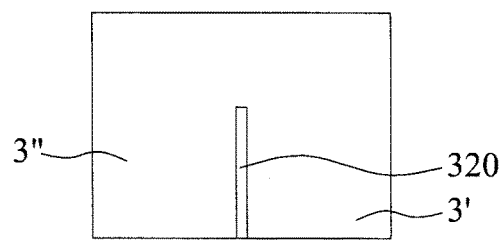
FIGS. 4A-4D are top views showing different types of first grooves according to the present invention.
Figure 4B:
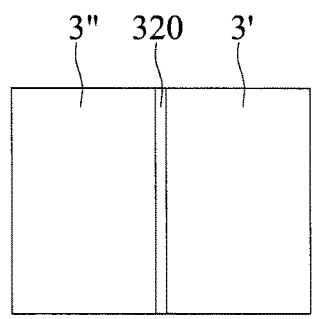
Figure 4C:
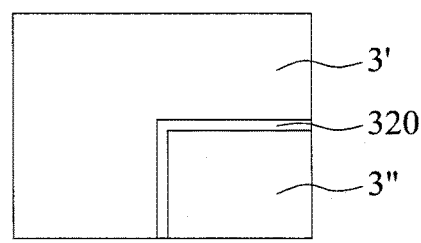
Figure 4D:
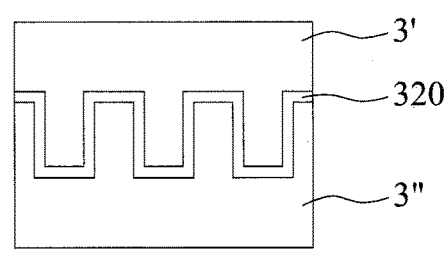

Further, the first groove 320 is cut in the shaped of, but not limited to, a straight line (including a short line, as shown in FIG. 4A, and a long line, as shown in FIG. 4B), a right-angle bent line, as shown in FIG. 4C, a continuous curved line, as shown in FIG. 4D.

Figure 5A:
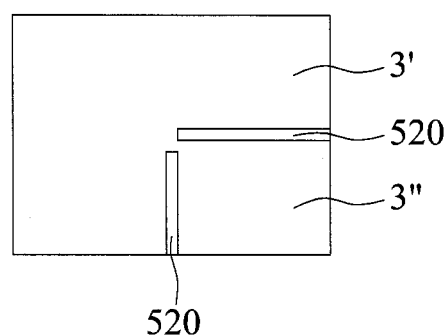
FIGS. 5A and 5B are top views showing other types of first grooves according to the present invention.
Figure 5B:
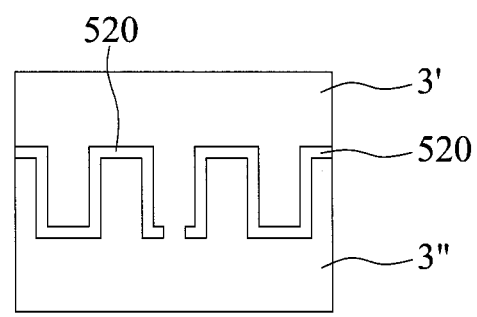

In another embodiment, a plurality of first grooves 520 are formed, as shown in FIGS. 5A and 5B. The first grooves 520 are arranged in a line, including an irregular right-angle line (shown in FIG. 5A) and a discontinuous line (shown in FIG. 5B).

In an embodiment, the semiconductor component 31 in one of the package units 3' is a Bluetooth chip, and the semiconductor component 3a in the other package units 3" is a Wi-Fi chip.

Figure 3E:
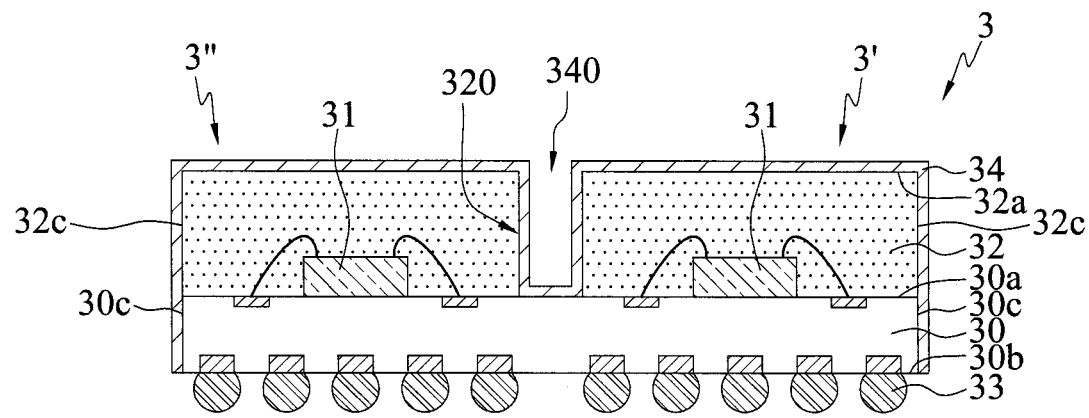
Figure 3E:
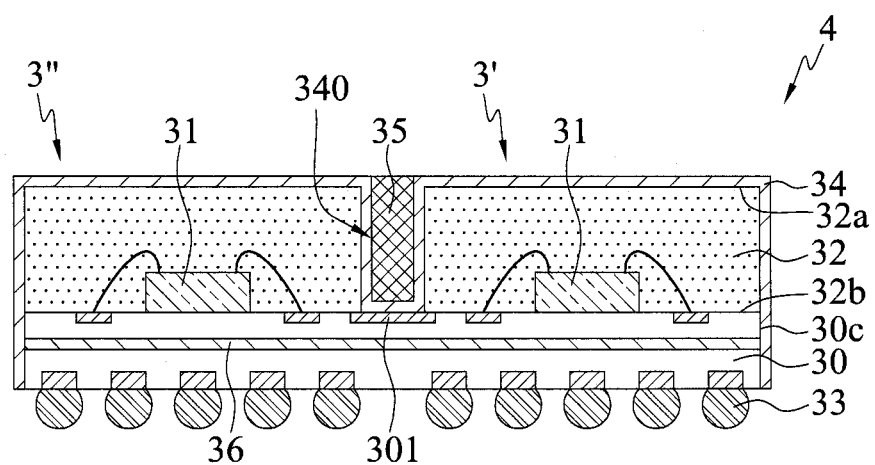

As shown in FIG. 3E, a sputtering using chemical plating, coating or reflow method can be performed, to form on the side surfaces 30c of the substrate 30 and the top surface 32a and side surfaces 32c of the encapsulant 32 a metal layer 34 that encapsulates a periphery of the package units 3' and 3", with the second surface 30b of the substrate 30 exposed from the metal layer 34. The metal layer 34 is disposed along wall surfaces of the first groove 320, and a second groove 340 having a metal surface is formed at a position corresponding to the first groove 320.

In an embodiment, the metal layer 34 and an air layer (i.e., the air present in the second groove 340) among the package units 3' and 3" serve as an EMI shielding structure that shield the semiconductor components 31 from EMI. For instance, the metal layer 34 and the air layer prevent electromagnetic interferences between the Bluetooth chip and the Wi-Fi chip from occurrence.

In an embodiment, the metal layer 34 is made of Cu, Ni, Fe, Al, or Sus. It should be noted, the metal layer 34 on each of the package units 3', 3" can be made of the same or different materials.

Further, the substrate 30 has a grounding structure that is electrically connected with the metal layer 34. In an embodiment, the grounding structure is a grounding part 301 located at a position corresponding to the first groove 320, as shown in FIG. 3E', and is electrically connected to the metal layer 34 (i.e., the bottom part of the second groove 340). In another embodiment, the grounding structure is a grounding layer 36 formed within the substrate 30 and electrically connected with the side surfaces 30c of the substrate 30, so as to enhance shielding effect.

In an embodiment, the second groove 340 is filled with a filling material 35, as shown in FIG. 3E', and the filling material 35 is an insulating material or a conductive material, and completely fills the second groove 340, wherein the top surface of the semiconductor package 4 is plane. In an embodiment that the filling material 35 is a conductive material, the conductivity of the filling material 35 is lower than the conductivity of the metal layer 34. Hence, the filling material 35 and the metal layer 34 form a multilayer isolated structure between the package units 3', 3", so as to increase shielding effects between the package units.

In an embodiment, a second groove 340 having a metal surface serves as a division means between the two package units 3' and 3", and a multilayer isolated structure thus exists, in order to enhance the shielding effects between the package units 3' and 3", thereby preventing the semiconductor components 31 from electromagnetically interfering with one another.

The present invention provides a semiconductor package 3, 4, for example, an RF module, comprising: a substrate 30, a plurality of semiconductor components 31, 31', an encapsulant 32, and a metal layer 34.

The substrate 30 has opposing first and second surfaces 30a and 30b.

The semiconductor components 31, 31' are formed on and electrically connected to the first surface 30a of the substrate 30. In an embodiment, the semiconductor components 31, 31' are RF chips, such as Bluetooth chips or Wi-Fi chips.

The encapsulant 32 covers the first surface 30s of the substrate 30 and the semiconductor components 31, 31'. The encapsulant 32 has at least one first groove 320, 520 that partitions, for facilitating the substrate 30 into a plurality of package units 3', 3", with each of the package units 3', 3" having at least one the semiconductor components 31, 31'. The encapsulant 32 has exposed top and side surfaces 32a and 32c and a bottom surface 32b coupled to the first surface 30a of the substrate 30, and the first groove 320, 520 penetrates the encapsulant 32 to communicate the top surface 32a with the first surface 30a of the substrate 30.

The metal layer 34 is formed on the side surfaces 30c of the substrate 30 and the top and side surfaces 32a and 32c of the encapsulant 32, and encapsulates the periphery of the package units 3', 3", with the second surface 30b of the substrate 30 exposed from the metal layer 34. In an embodiment, the metal layer 34 is disposed along the wall surfaces of the first groove 320, 520, and a second groove 340 having a metal surface is formed at a position corresponding in position to the first groove 320, 520. The metal layer 34 is made of one selected from a group consisting of copper, nickel, iron, aluminum and stainless steel.

In an embodiment, the encapsulant 32 is configured with a plurality of the first grooves 520, and the first grooves 520 are arranged in a line.

In an embodiment, the substrate 30 has a grounding structure, such as a grounding layer 36 formed within the substrate 30, or a grounding part 301 formed at a position corresponding to the first groove 320, and the grounding structure is electrically connected with the metal layer 34 and is electrically connected to the metal layer 34.

In an embodiment, the semiconductor package 4 further comprises a filling material 35 formed in the second groove 340 and made of an insulating material or conductive material.

In summary, the semiconductor package and the related method according to the present invention are characterized by having a second groove and forming a multilayer isolated structure among a plurality of package units, such that the multilayer isolated structure shields the semiconductor components from electromagnet interferes.

The present invention has been described using exemplary preferred embodiments. However, it is to be understood that the scope according to the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
a substrate having opposing first and second surfaces;
a plurality of semiconductor components disposed on and electrically connected to the first surface of the substrate;
an encapsulant encapsulating the first surface of the substrate and the semiconductor components and having at least one first groove that partitions the substrate into a plurality of package units, wherein each of the package units has at least one of the semiconductor components;
a metal layer formed on the substrate and the encapsulant and encapsulating a periphery of the package units, with the second surface of the substrate exposed from the metal layer, wherein the metal layer is formed on a groove surface of the first groove, to form a second groove corresponding in position to the first groove and having a metal surface; and
a filling material for filling the second groove, wherein the filling material is an insulating material or a conductive material having a conductivity lower than that of the metal layer.

2. The semiconductor package of claim 1, wherein the semiconductor package is a radio-frequency (RF) module.

3. The semiconductor package of claim 1, wherein the semiconductor components are RF chips.

4. The semiconductor package of claim 3, wherein the RF chips are Bluetooth chips or Wi-Fi chips.

5. The semiconductor package of claim 1, wherein the encapsulant has an exposed top surface, an exposed side surface, and a bottom surface coupled to the first surface of the substrate, and the at least one first groove penetrates the encapsulant to communicate the exposed top surface of the encapsulant with the first surface of the substrate.

6. The semiconductor package of claim 5, wherein the metal layer is formed on the exposed top surface and the exposed side surface of the encapsulant.

7. The semiconductor package of claim 1, wherein the metal layer is made of a material selected from the group consisting of copper, nickel, iron, aluminum and stainless steel.

8. The semiconductor package of claim 1, wherein, when the encapsulant has a plurality of the first grooves, the first grooves are arranged in a line.

9. The semiconductor package of claim 1, wherein the substrate has a grounding structure electrically connected with the metal layer.

10. The semiconductor package of claim 9, wherein the grounding structure is a grounding part which corresponds in position to the first groove and is electrically connected to the metal layer.

* * * * *